Aug. 22, 1967 H. R. RIGGERT 3,337,815

LINEAR VOLTAGE TO FREQUENCY CONVERTER

Filed Feb. 12, 1964

INVENTOR
HAROLD R. RIGGERT

BY Q. C. Smith
AGENT

United States Patent Office 3,337,815
Patented Aug. 22, 1967

3,337,815

LINEAR VOLTAGE TO FREQUENCY CONVERTER

Harold R. Riggert, Sudbury, Mass., assignor to Hewlett-Packard Company, Palo Alto, Calif., a corporation of California Filed Feb. 12, 1964, Ser. No. 344,437
2 Claims. (Cl. 331—111)

ABSTRACT OF THE DISCLOSURE

A current source is used for delivering charge to the timing capacitor of a unijunction relaxation oscillator at a rate linearly determined by the magnitude of an analog input voltage. The output signal of the oscillator has a frequency that varies linearly with the analog input voltage. A control circuit is included in the oscillator for frequency calibration, and a gating circuit is connected to the oscillator for gating it off.

This invention relates to signal apparatus for use in voltage to frequency conversion and more particularly to a simplified circuit arrangement for providing linear voltage to frequency conversion.

Many prior art voltage to frequency converters utilize a timing capacitor which is charged from a first predetermined voltage level to a second predetermined voltage level. A threshold detector is used to detect when the voltage across the timing capacitor has reached the second predetermined voltage level and to activate an amplifier in response thereto.

These prior art voltage to frequency converters generally use a threshold detector comprising a biased diode and a blocking oscillator. When the second predetermined voltage level is reached, the diode conducts sufficiently to trigger the blocking oscillator which activates the amplifier. Voltage to frequency converters of this type are generally expensive and typically require additional circuitry to obtain linear voltage to frequency conversion.

Accordingly, it is the principal object of this invention to provide a simple, low cost voltage to frequency converter for providing linear voltage to frequency conversion.

In accordance with the illustrated embodiment of this invention there is provided a current source which charges a capacitor with currents proportional to the magnitude of the voltage to be converted. There is further provided a threshold detector including a uni-junction having emitter, first base, and second base electrodes. The first and second base electrodes are adjustably biased to permit variation in the potential difference therebetween, and the emitter and first base electrodes are connected across the capacitor. In operation, the junction between the emitter and first base electrodes conducts regeneratively when the voltage across the capacitor exceeds a first voltage level determined by the selected potential difference between the base electrodes. This regenerative conduction reduces the voltage across the capacitor to a second voltage level at which the junction becomes non-conductive. An electrical signal is generated at the emitter electrode in response to the changes in the conductive state of the junction. The frequency of this electrical signal is a linear function of the voltage to be converted.

Figure 1:
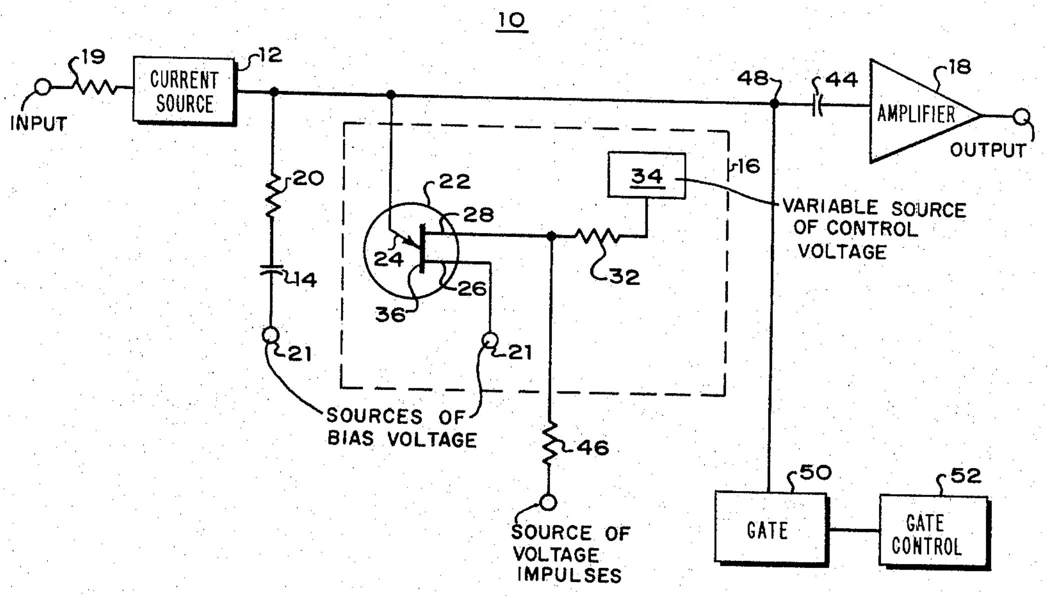
Figure 2:
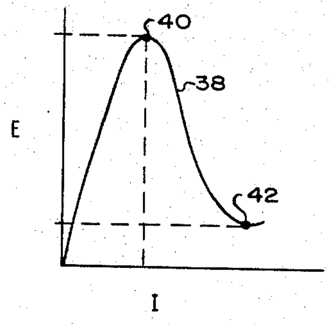

Other and incidental objects of this invention will be apparent from a reading of this specification and an inspection of the accompanying drawing in which:

FIGURE 1 is a schematic diagram of a voltage to frequency converter according to this invention; and FIGURE 2 shows the voltage-current characteristic of the junction between the emitter and first base electrodes of the uni-junction transistor of FIGURE 1.

Referring to FIGURE 1 there is shown a voltage to frequency converter 10 including a current source 12, a timing capacitor 14, a threshold detector 16 and an amplifier 18. The current source 12 is connected to generate currents which are directly proportional to the voltage to be converted and to charge the timing capacitor 14 therewith. For example, the current source is a transistor, the emitter of which is maintained at a virtual ground independently of temperature. The emitter is connected to the source of the voltage to be converted by means of a resistor 19. The collector of the transistor is connected to the input of the threshold detector 16 and by means of a small resistor 20 to one terminal of the timing capacitor 14. A power supply 21 is connected to the other terminal of the timing capacitor 14.

The threshold detector 16 includes a uni-junction transistor 22 having emitter, first base, and second base electrodes 24, 26 and 28, respectively. The power supply 21 is connected to bias the first base electrode 26. A resistor 32 which is selected to optimize the temperature compensation of the uni-junction transistor 22 connects the second base electrode 28 to a source of variable potential 34. By adjustment of the source of variable potential 34, the potential difference between the base electrodes 26 and 28 is selected. The emitter and first base electrodes 24 and 26 are connected to opposite sides of the timing capacitor 14 and form a discharge circuit therefor.

The junction 36 between the emitter and first base electrodes 24 and 26 has a voltage-current characteristic as shown in FIGURE 2. This characteristic exhibits a negative resistance region 38 between a peak point 40 and a valley point 42. The voltage at the peak point 40 is directly proportional to the potential difference between the base electrodes 26 and 28 and may therefore be selected by adjustment of the source of variable potential 34.

In operation, the junction 36 conducts when the minimum current supplied by the current source 12 to the input of the threshold detector 16 is equal to the current of the peak point 40. The timing capacitor 14 which is then charged to the voltage of the peak point 40 begins discharging through the resistor 20 and the junction 36. Resistor 20 serves to protect the junction 36 from overheating. Since the junction 36 is not stable in its negative resistance region 38, it conducts regeneratively until the voltage across the timing capacitor 14 has discharged to the level of the valley point 42. At this level of voltage the junction 36 switches to its original non-conductive state and voltage again begins building up across the timing capacitor 14. In this manner the threshold detector 16 quantizes the charge delivered to the timing capacitor 14. Since the charging of the timing capacitor 14 is proportional to the voltage to be converted, so is the rate of quantization, thereby accomplishing linear voltage to frequency conversion. Linearity of voltage to frequency conversion within several tenths of one percent is obtainable. For example, for a rise in temperature of twenty degrees centigrade, gain instability has checked out within 0.5 percent and zero instability within 0.2 percent of full scale. Frequency calibration is provided by adjustment of the source of variable potential 34 which varies the voltage level of the peak voltage 40.

A pulse is generated at the emitter electrode 24 in response to the changes in the conductive state of the junction 36. This pulse may be coupled by the capacitor 44 to an amplifier 18 for amplification thereby. For linear voltage to frequency conversion the maximum pulse repetition rate is that rate at which the discharge time of the capacitor becomes a significant portion of its charge time. The minimum pulse repetition rate is governed by the quantity of current required to trigger the threshold detector 16. This quantity of current is equivalent to that at the peak point 40. To lower this minimum repetition rate a resistor 46 is connected to the second base for coupling voltage spikes of a polarity to reduce the voltage at the peak point (40) a small amount. This causes the timing capacitor 14 to supply the necessary current to trigger the threshold detector 16, and insures regenerative conduction for very small values of voltage across the timing capacitor 14. Alternatively the current source 12 might be modified to supply additional current necessary to trigger the threshold detector 16 when the input current is small. Gating of the threshold detector 16 is provided by a gating input at 48. The gate 50 is actuated in response to electrical signals of selected duration generated by a gate control circuit 52.

I claim:

1. A voltage to frequency converter comprising:

an input for receiving an analog input voltage to be converted;

a charging circuit including a capacitor;

a current source connected between said input and said charging circuit, said current source being responsive to the analog input voltage at said input for charging said capacitor from a first voltage level to a second voltage level at a rate determined by the magnitude of the analog input voltage;

a solid state detector having at least one control electrode and having a current conduction path that is connected across said capacitor, said current conduction paths remaining substantially nonconductive while said capacitor is charged from the first voltage level to the second voltage level and providing a regeneratively conductive discharge path for said capacitor when the voltage across said capacitor reaches the second voltage level and until the voltage across said capacitor decreases to the first voltage level;

a variable source of control voltage connected to said control electrode for controlling the second voltage level; and an amplifier connected to said current conduction path, said amplifier being responsive to the changes in the conductivity of said current conduction path for providing an amplified output pulse train having a repetition rate that varies linearly with the magnitude of the analog input voltage.

2. A voltage to frequency converter as in claim 1 including:

a source of voltage impulses connected to said control electrode for decreasing the second voltage level by a selected amount at selected intervals; and a gating circuit connected to said current conduction path for gating said detector off during a selected period.

References Cited

UNITED STATES PATENTS

| | | | |
|---|---|---|---|
| 3,074,028 | 1/1963 | Mamano | 331—111 |
| 3,114,114 | 12/1963 | Atherton et al. | 331—111 |
| 3,158,822 | 11/1964 | Brechling | 331—111 |

OTHER REFERENCES

GE "Transistor Design Package," vol. 3, folio 1, February 1963.

Sylvan: Notes on the Application of the Silicon Unijunction Transistor, General Electric, 90.10 5/61, May 1961, pp. 37–40, 59–64.

ROY LAKE, *Primary Examiner.*

S. H. GRIMM, *Assistant Examiner.*